(12) United States Patent
Wieneke Kessler et al.

(10) Patent No.: US 7,791,177 B2
(45) Date of Patent: Sep. 7, 2010

(54) ELECTRONIC DEVICE

(75) Inventors: Angela Wieneke Kessler, Sinzing (DE); Wolfgang Schober, Amberg (DE); Roman Peters, Hainsacker (DE)

(73) Assignee: Infineon Technologies AG, Neubiberg (DE)

( * ) Notice: Subject to any disclaimer, the term of this patent is extended or adjusted under 35 U.S.C. 154(b) by 132 days.

(21) Appl. No.: 11/953,380

(22) Filed: Dec. 10, 2007

(65) Prior Publication Data

US 2009/0146272 A1 Jun. 11, 2009

(51) Int. Cl.
*H01L 23/496* (2006.01)
*H01L 21/56* (2006.01)

(52) U.S. Cl. .............. 257/666; 257/E23.031; 257/E21.502

(58) Field of Classification Search ......... 257/678–733, 257/787–796, E23.001–E23.194, 666, E21.502, 257/E23.031
See application file for complete search history.

(56) References Cited

U.S. PATENT DOCUMENTS

| 4,890,152 | A | * | 12/1989 | Hirata et al. ............... 257/666 |
| 5,254,864 | A | | 10/1993 | Ogawa |
| 5,886,863 | A | | 3/1999 | Nagasaki et al. |
| 7,199,461 | B2 | | 4/2007 | Son et al. |
| 2002/0153637 | A1 | | 10/2002 | Chandra |

FOREIGN PATENT DOCUMENTS

EP 0911877 4/1999

* cited by examiner

*Primary Examiner*—Fernando L. Toledo
*Assistant Examiner*—Mamadou Diallo
(74) *Attorney, Agent, or Firm*—Dicke, Billig & Czaja PLLC

(57) ABSTRACT

Embodiments provide an electronic device including a carrier defining a first major surface, a chip attached to the first major surface, an array of leads connected to the first major surface, and a thickness of encapsulation material disposed on the first major surface of the carrier. Each lead extends through the thickness of the encapsulation material.

16 Claims, 10 Drawing Sheets

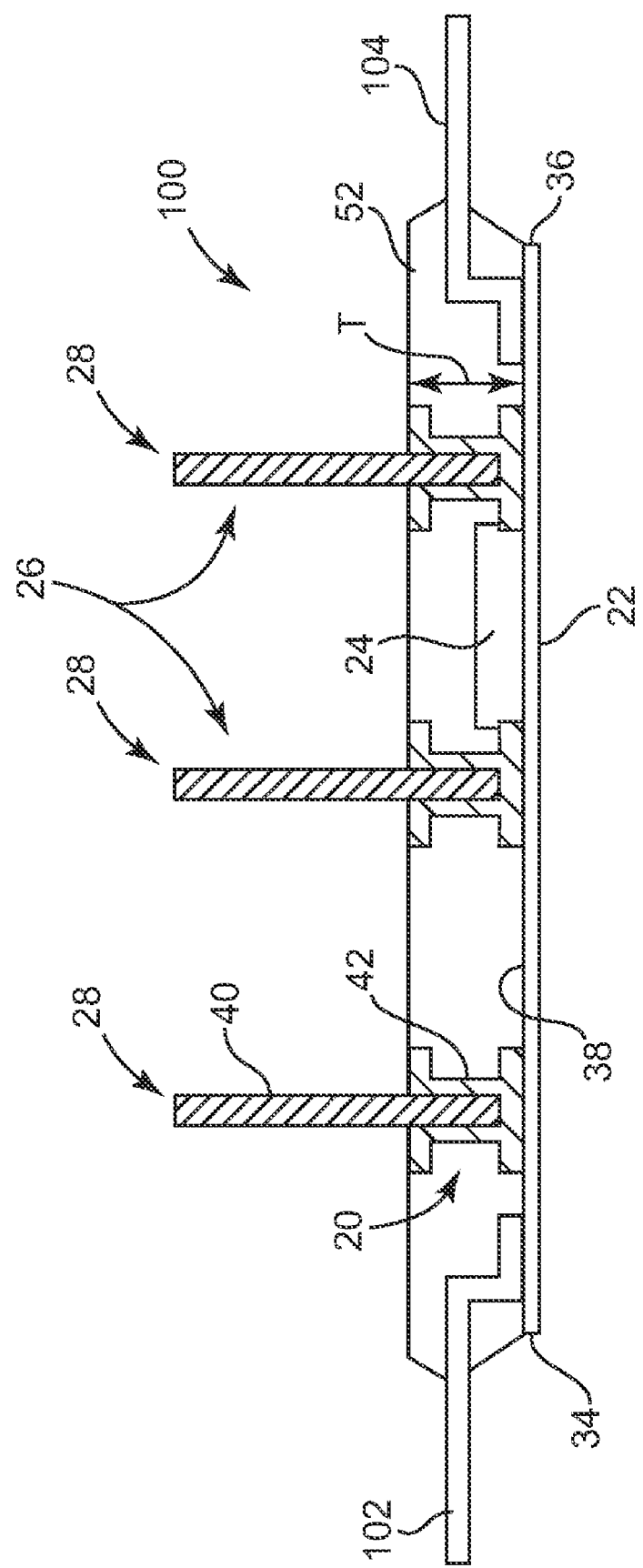

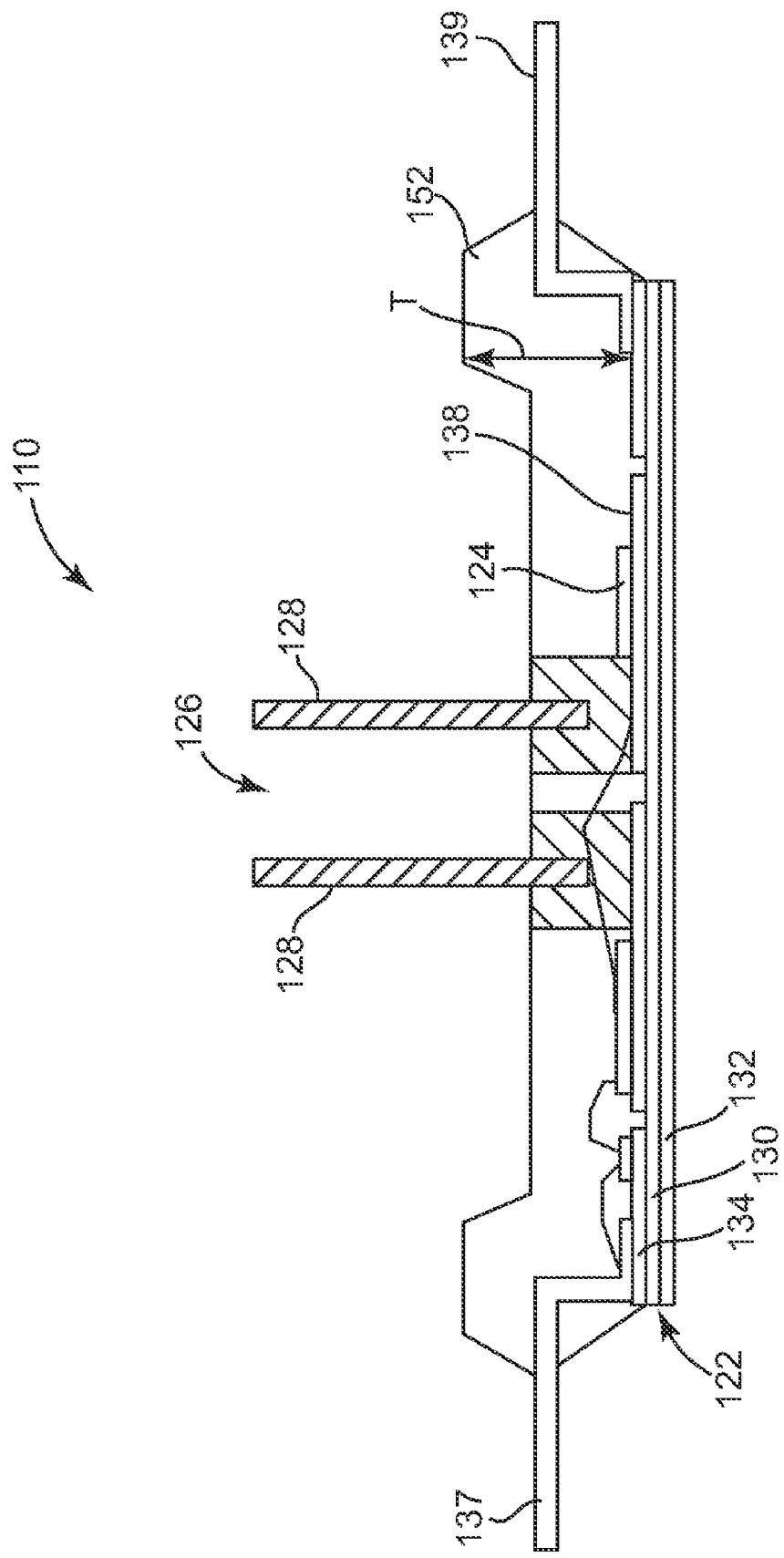

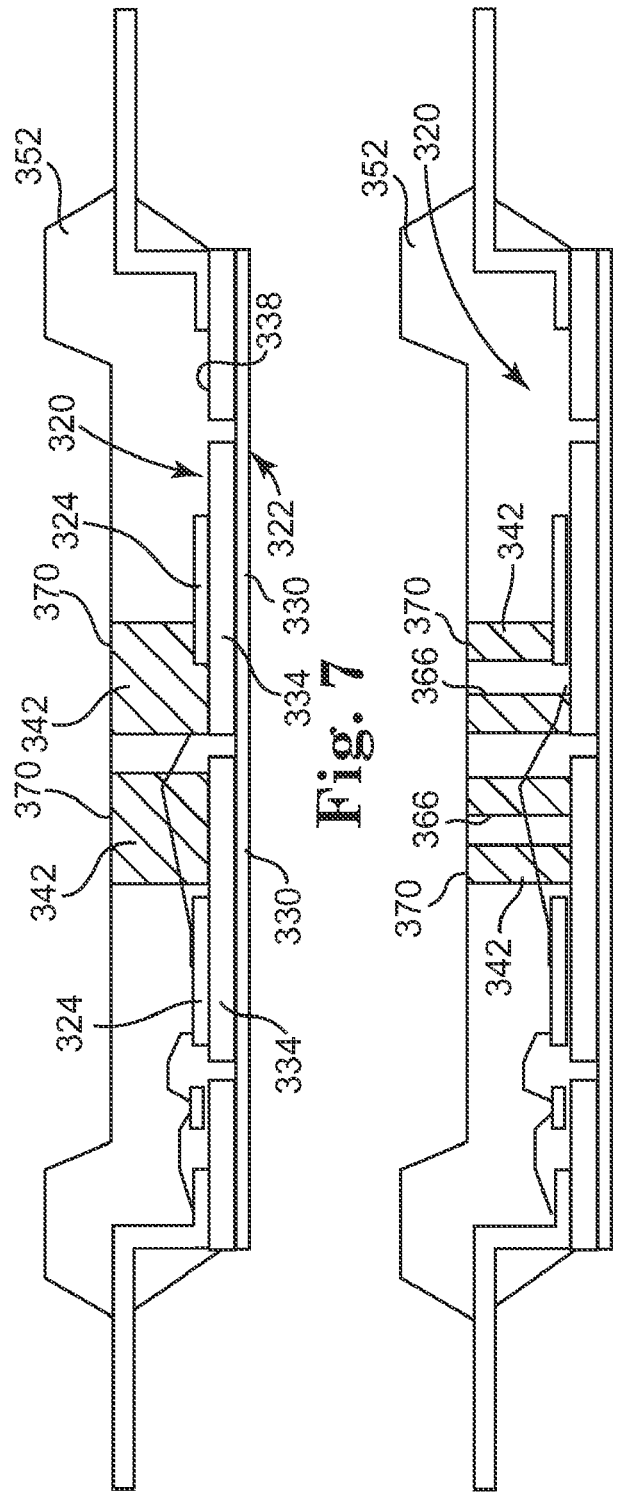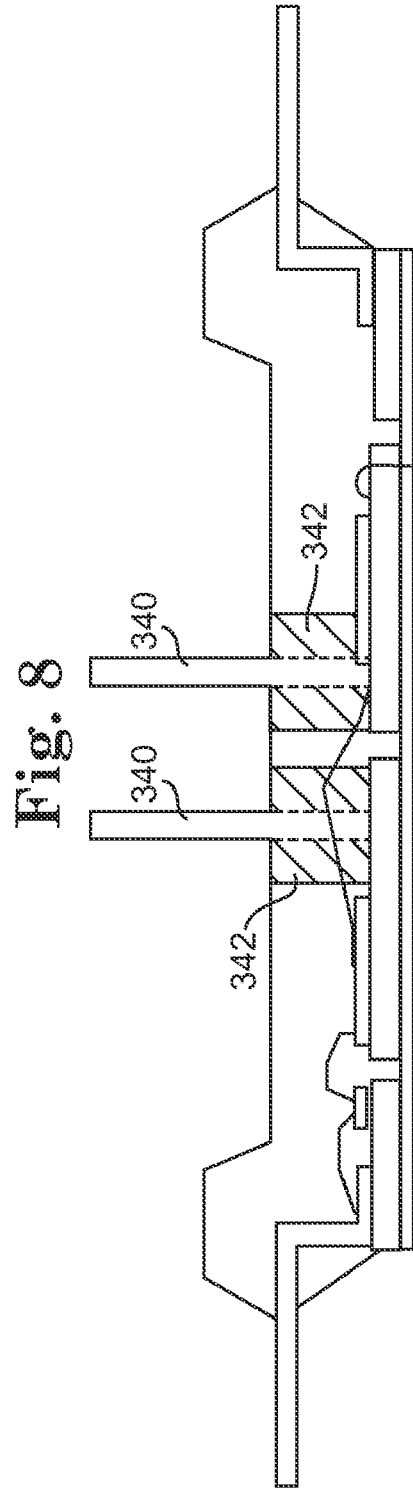

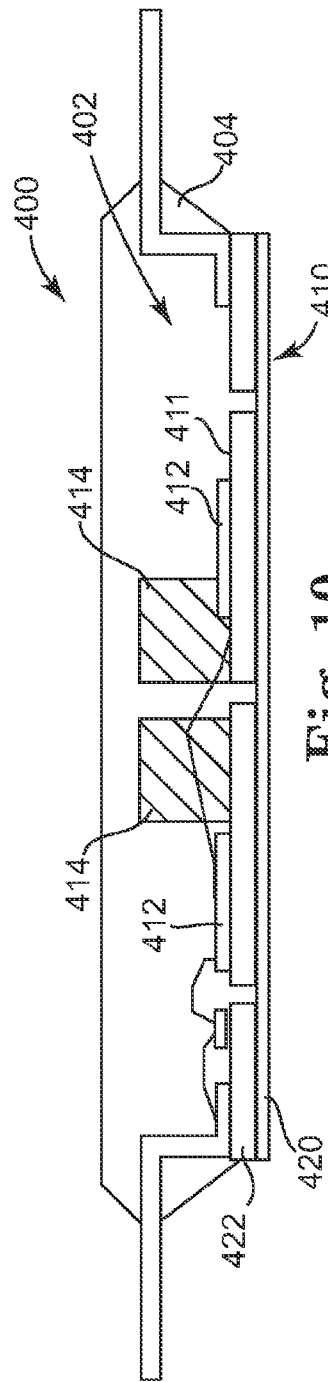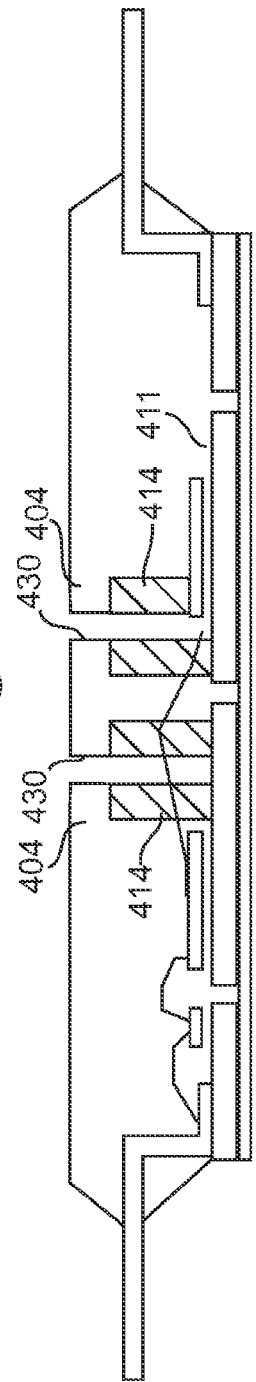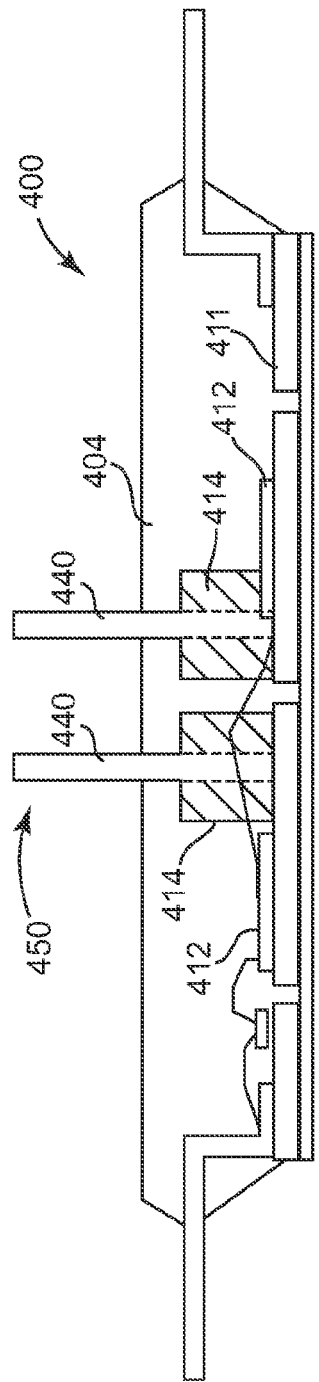

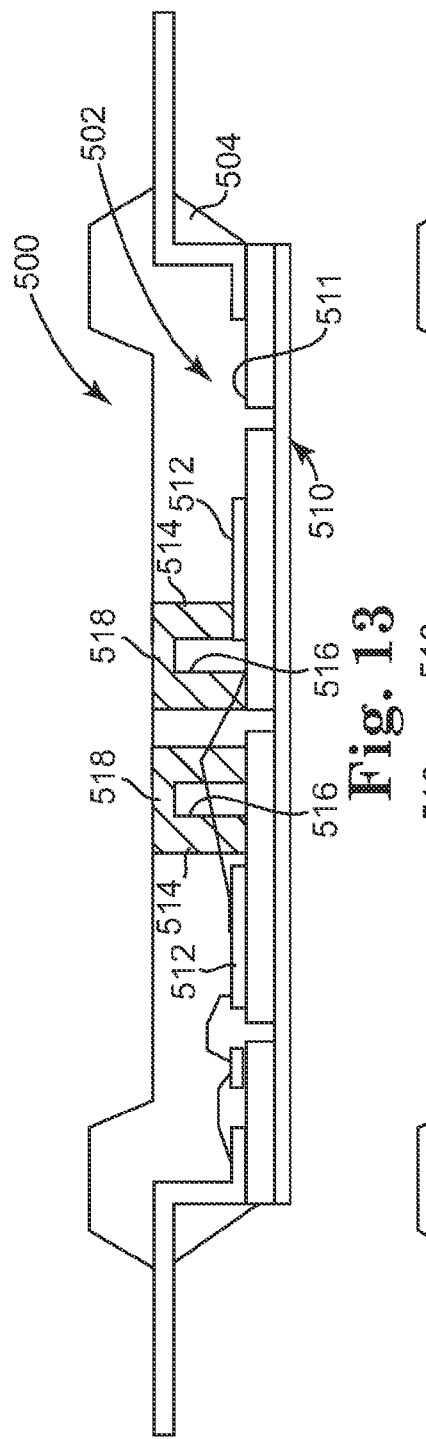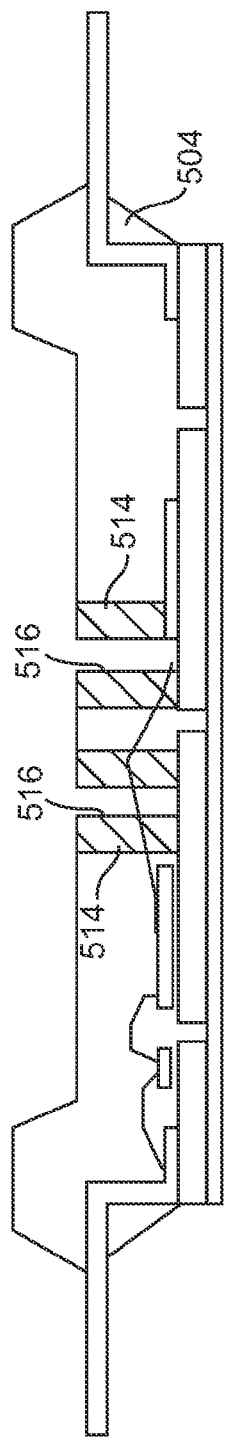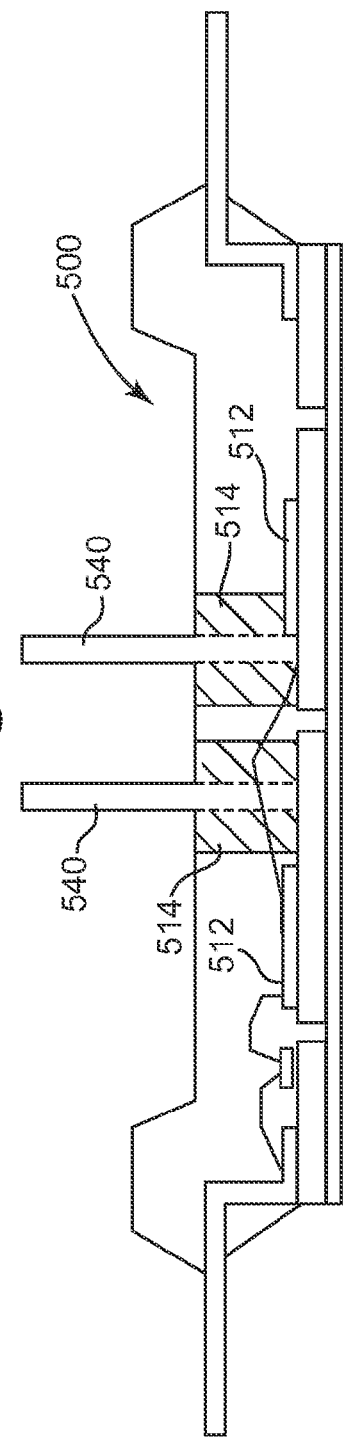

US 7,791,177 B2

ELECTRONIC DEVICE

BACKGROUND

Semiconductor packages provide protection to integrated circuit chips enclosed within the package from environmental conditions such as thermal variations and vibrations. Semiconductor packages include a supporting carrier, one or more chips electrically coupled to the carrier, encapsulating material molded over the carrier and the chip(s), and leads configured to electrically connect the chip to the "outside" world.

Creepage distance is the distance between adjacent leads. For high voltage applications, it is desirable that the creepage distance be large enough to accommodate a sufficiently high voltage without arcing or electrical failure between the adjacent leads. The creepage distance can be increased by increasing the size of the package, which increases the length of the side peripheral edges of the package, and thus the spacing between adjacent leads extending from the side peripheral edges. However, it is generally undesirable to increase the package size since most customers/users demand ever smaller packages.

For these and other reasons there is a need for the present invention.

SUMMARY

One aspect provides an electronic device including a carrier defining a first major surface, a chip attached to the first major surface, an array of leads connected to the first major surface, and a thickness of encapsulation material disposed on the first major surface of the carrier. Each lead extends through the thickness of the encapsulation material.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIG. 3A is a partial cross-sectional view of an electronic device including an array of leads connected to a major surface of a leaded carrier according to another embodiment.

FIG. 3B is a partial cross-sectional view of an electronic device including an array of leads connected to a major surface of another carrier according to one embodiment.

FIGS. 7-9 are partial cross-sectional views of a process for fabricating an electronic device including an array of leads connected to a major surface of a carrier according to another embodiment.

FIGS. 10-12 are partial cross-sectional views of a process for fabricating an electronic device including an array of leads connected to a major surface of a carrier according to another embodiment.

FIGS. 13-15 are partial cross-sectional views of another process for fabricating an electronic device including an array of leads connected to a major surface of a carrier according to one embodiment.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise. As employed in this Specification, the term "electrically coupled" does not mean that the elements must be directly coupled together; intervening elements may be provided between the "electrically coupled" elements.

Embodiments provide an electronic device having a high number of input/output leads. Embodiments provide an array of input/output leads connected to a major surface of a carrier of an electronic device, where the relatively large number of leads are suitably spaced to minimize voltage creepage between adjacent leads. In one embodiment, leads in the array include a first portion connected to the carrier that is molded in situ when encapsulating plastic over the carrier, and a separate second portion that is inserted into the first portion to form a lead extending vertically through the encapsulation material.

In one embodiment, the leads in the array of leads are distributed over the area of the first major surface. More leads are provided compared to a conventional package since the area of the first major surface is larger than the area of the peripheral sides of the package. In addition, more space between adjacent leads is provided compared to a conventional package, which minimizes voltage creepage between adjacent leads without necessitating an increase in the overall size of the semiconductor package.

Figure 1:
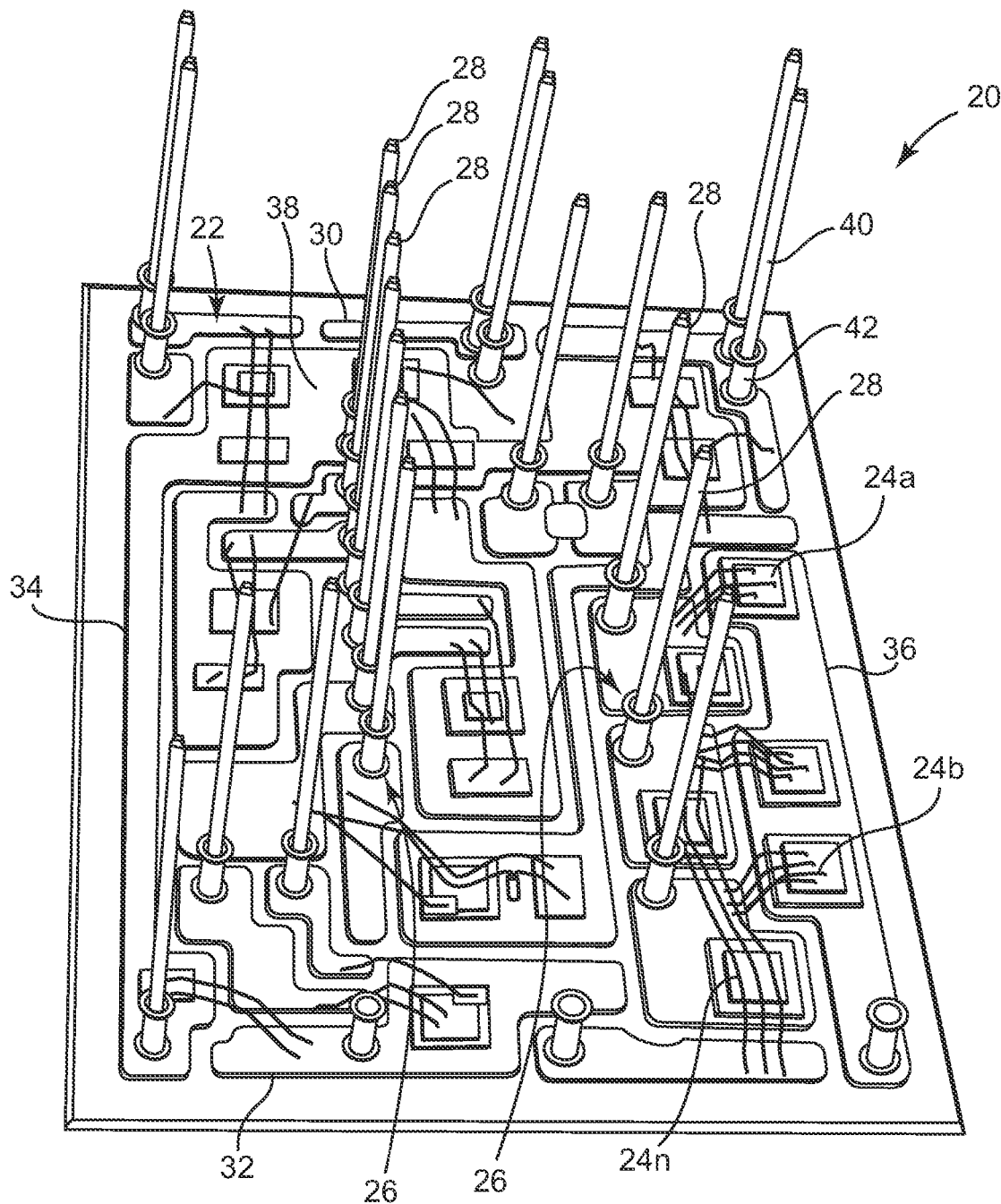
FIG. 1 is a perspective view of a semiconductor package module for use in an electronic device that includes an array of leads connected to a major surface of a carrier according to one embodiment.

FIG. 1 is a perspective view of a semiconductor package module 20 according to one embodiment. Semiconductor package module 20 is suited for use as a semiconductor package after molding module 20 with an encapsulating material. In one embodiment, semiconductor package module 20 includes a carrier 22, chips 24a, 24b . . . 24n connected to carrier 22, and an array 26 of leads 28 connected to carrier 22. For descriptive clarity, semiconductor package module 20 is illustrated prior to encapsulating module 20 with mold material. In particular, a second lead component 42 is first connected to a major surface 38 of carrier 22, and then carrier 22 and array 26 of second lead components 42 are molded in plastic prior to inserting the generally vertical first lead components 40 into a respective one of the second lead components 42. The illustration of FIG. 1 provides an unobstructed view of the array 26 of leads 40/42.

In one embodiment, carrier 22 includes opposing lateral edges 30, 32, opposing longitudinal edges 34, 36, and a major surface 38 extending between lateral edges 30, 32 and longitudinal edges 34, 36. Carrier 22 includes leaded leadframes such as Quad Flat Package (QFP) leadframes, Dual In-line Package (DIP) leadframes, small outline package (SOP) leadframes, or other leaded leadframes. In another embodiment, carrier 22 includes non-leaded leadframes such as very thin profile quad flat non-leaded (VQFN) packages and Thin Small Leadless Packages (TSLP). In another embodiment, carrier 22 includes a direct copper bonded carrier having at least a first metal layer deposited on a ceramic layer. Other forms of leadframes and/or carrier substrates are also acceptable.

Chip 24a, 24b, . . . 24n includes semiconductor chips in general, memory and/or logic chips, integrated circuits having vertical power transistors, or any other chip suitable for use in a semiconductor package. For example, in one embodiment carrier 22 is a direct copper bonded carrier and chip 24 includes an integrated circuit having a first electrode on a first face and a second electrode on a second face opposite the first face, where the first electrode is electrically connected to carrier 22, for example by diffusion soldering.

In one embodiment, each lead 28 in the array 26 of leads includes first lead component 40 inserted into second lead component 42. Second lead components 42 are connected to and distributed over major surface 38 of carrier 22. First lead components 40 are subsequently electrically connected to second lead component 42 (and carrier 22). To this end, first lead component 40 extends away from carrier 22 for electrical connection to the devices.

Figure 2:
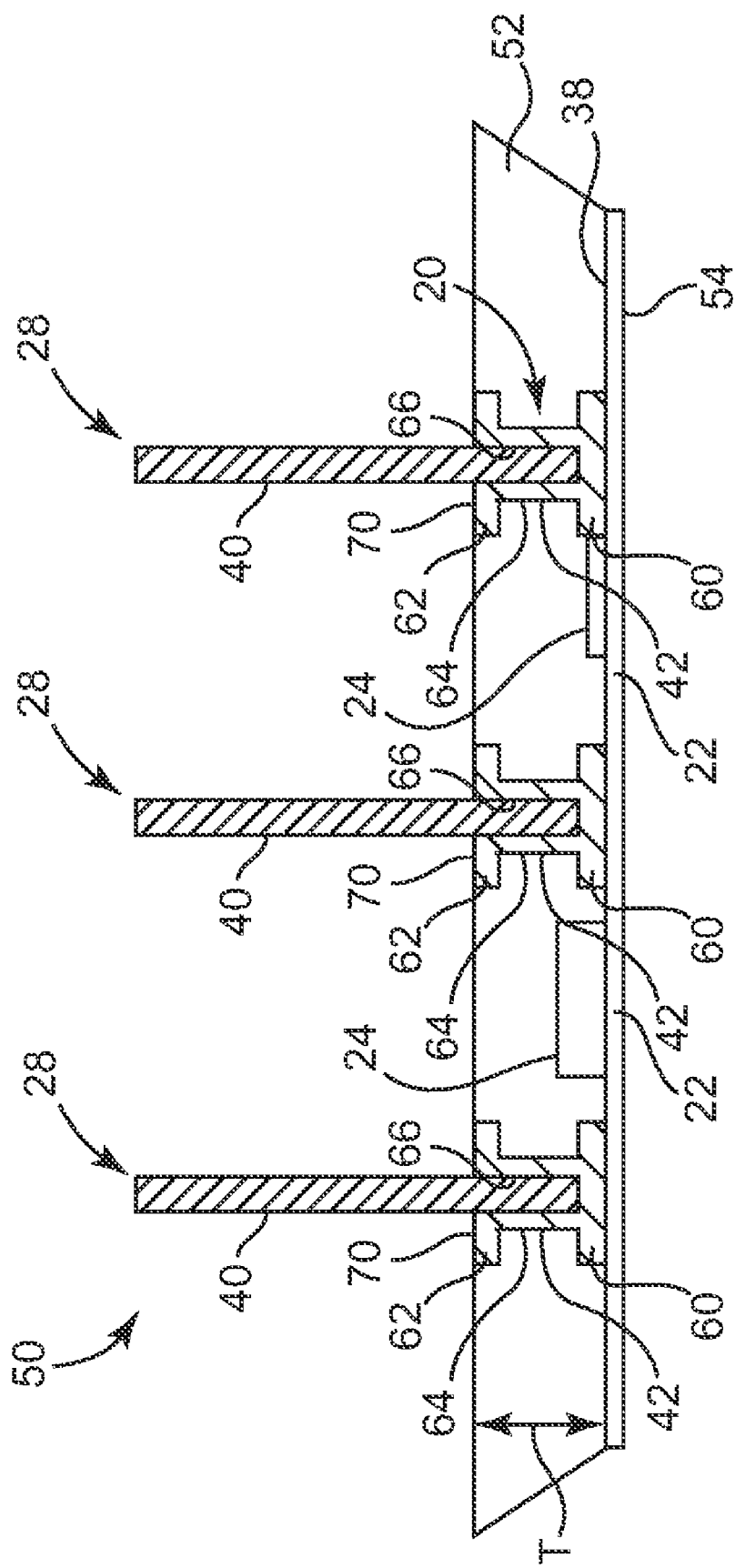
FIG. 2 is a partial cross-sectional view of an electronic device including an array of leads connected to a major surface of a carrier according to one embodiment.

FIG. 2 is a partial cross-sectional view of an electronic device 50 according to one embodiment. Portions of electronic device 50 are not shown in cross-hatched lines for improved visual clarity. Electronic device 50 includes module 20 and encapsulation material 52 molded around a portion of module 20. In one embodiment, carrier 22 includes a non-leaded leadframe that defines a second major surface 54 opposite first major surface 38. Chips 24 and leads 28 are connected to first major surface 38 of carrier 22, and second major surface 54 is exposed relative to encapsulating material 52.

A thickness T of a plastic encapsulation material 52 is disposed over first major surface 38 of carrier 22, between each lead 28 in the array 26 of leads, and over chip 24. Suitable plastics for encapsulation material 52 include thermoplastics, thermosetting plastics, and curable plastics. Other non-conducting mold materials are also acceptable for encapsulating material 52.

In one embodiment, second lead component 42 includes a base 60 connected to first major surface 38 of carrier 22, a shoulder 62 opposite base 60, and a body 64 extending between base 60 and shoulder 62. In one embodiment, at least the shoulder 62 and body 64 are fabricated to define a hole 66 that is sized to receive first lead component 40.

Figure 4:
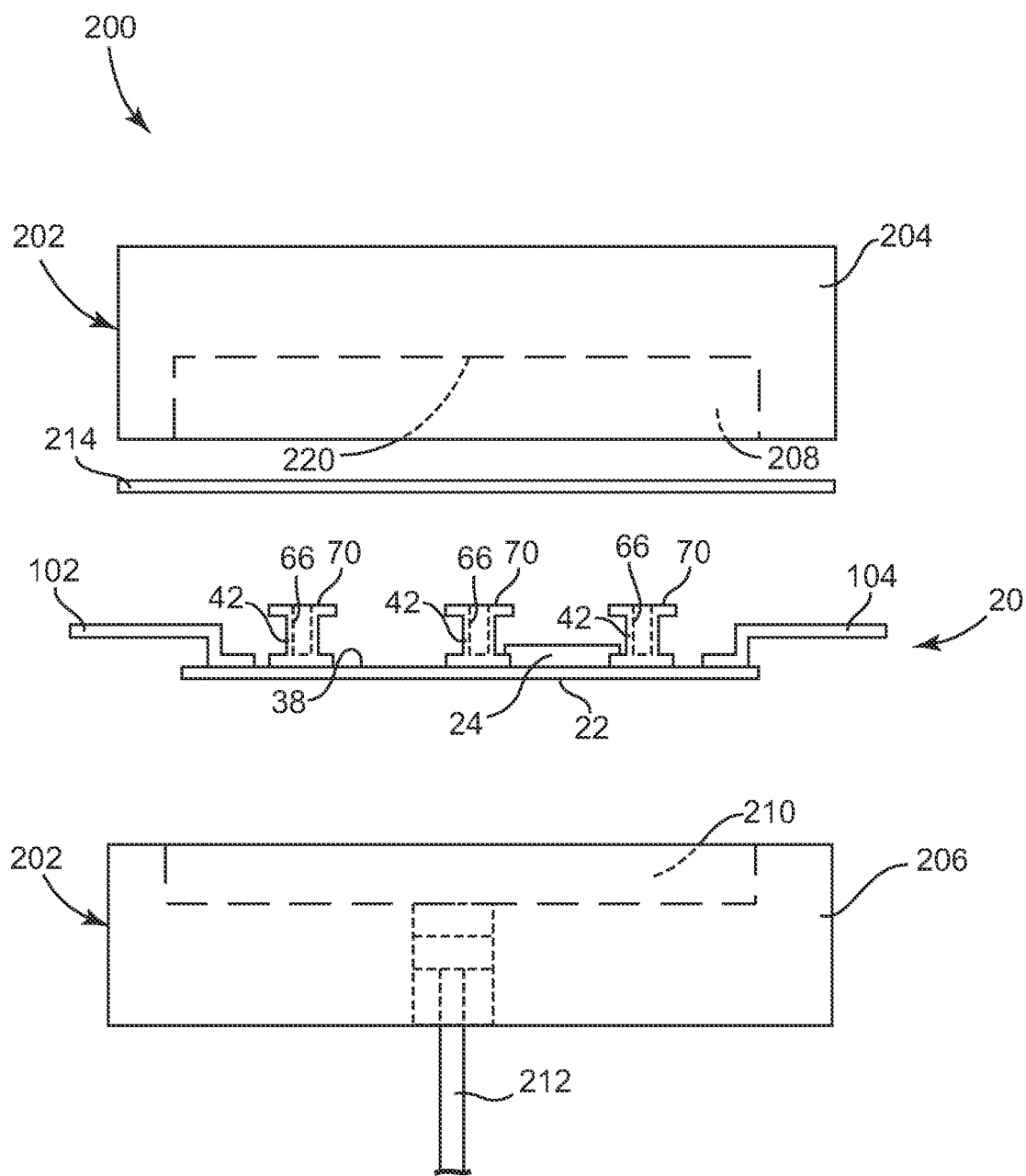
FIGS. 4-6 are partial cross-sectional views of a process for fabricating an electronic device including an array of leads connected to a major surface of a carrier according to one embodiment.

In one embodiment, shoulder 62 defines a sealing surface 70 that enables sealing module 20 into a mold cavity. The mold is sealed onto sealing surface 70 and encapsulation material 52 is molded around second lead component 42 (as best illustrated in FIG. 4). Generally, it is desired that first lead component 40 has access to hole 66. In one embodiment, hole 66 is protectively covered such that hole 66 is not filled with encapsulation material 52 during molding. In another embodiment, encapsulation material 52 covers sealing surface 70 of second lead component 42, and hole 66 is later formed in encapsulation material 52 and second lead component 42.

FIG. 3A is a partial cross-sectional view of another electronic device 100 according to one embodiment. Electronic device 100 includes a leaded carrier 22 provided with peripheral leads 102, 104 extending from sides 34, 36, respectively, of carrier 22. Electronic device 100 is similar to electronic device 50 (FIG. 2) and includes leads 28 connected to major surface 38 of carrier 22. A thickness T of encapsulation material 52 is disposed over first major surface 38 of carrier 22, between each lead 28 in the array of leads, and over chip 24. In another embodiment, encapsulation material 52 entirely covers both major surfaces of carrier 22.

FIG. 3B is a partial cross-sectional view of another electronic device 110 according to one embodiment. Electronic device 110 includes a carrier 122 defining a first major surface 138, a chip 124 connected to first major face 138, and an array 126 of leads 128 connected to first major surface 138. In one embodiment, carrier 122 is a direct copper bonded carrier including a ceramic layer 130, a first metal layer 132 connected to ceramic layer 130, and a second metal layer 134 connected to ceramic layer 130 opposite first metal layer 132. In one embodiment, second metal layer 134 defines first major face 138, and first metal layer 132 is exposed relative to encapsulation material 152 and configured for electrical connection to other devices.

In one embodiment, ceramic layer 130 includes oxide layers or silicon oxide layers or nitrogen-oxide layers, and metal layers 132, 134 include conductive metals, in which one suitable conductive metal includes copper.

In one embodiment, peripheral leads 137, 139 are connected to metal layer 134 of carrier 122 and extend from opposing peripheral sides of device 110. A thickness T of encapsulation material 152 is disposed over first major surface 138 of carrier 122, between each lead 128 in the array 126 of leads, and over chip 124. In one embodiment, leads 128 are distributed over first major surface 138 of carrier 122, and generally extend normal to carrier 122 such that leads 128 project through the thickness T of encapsulation material 152.

Figure 5:
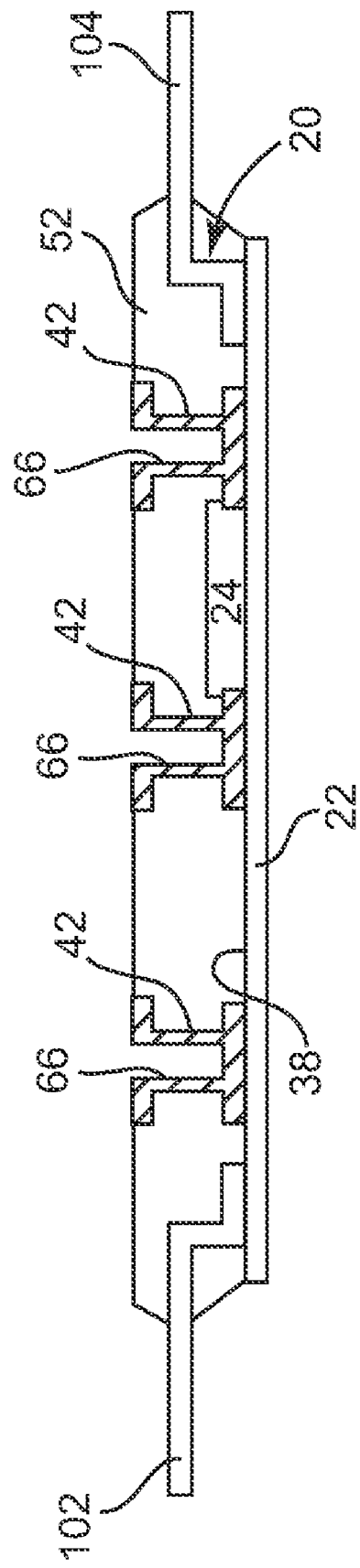
Figure 6:
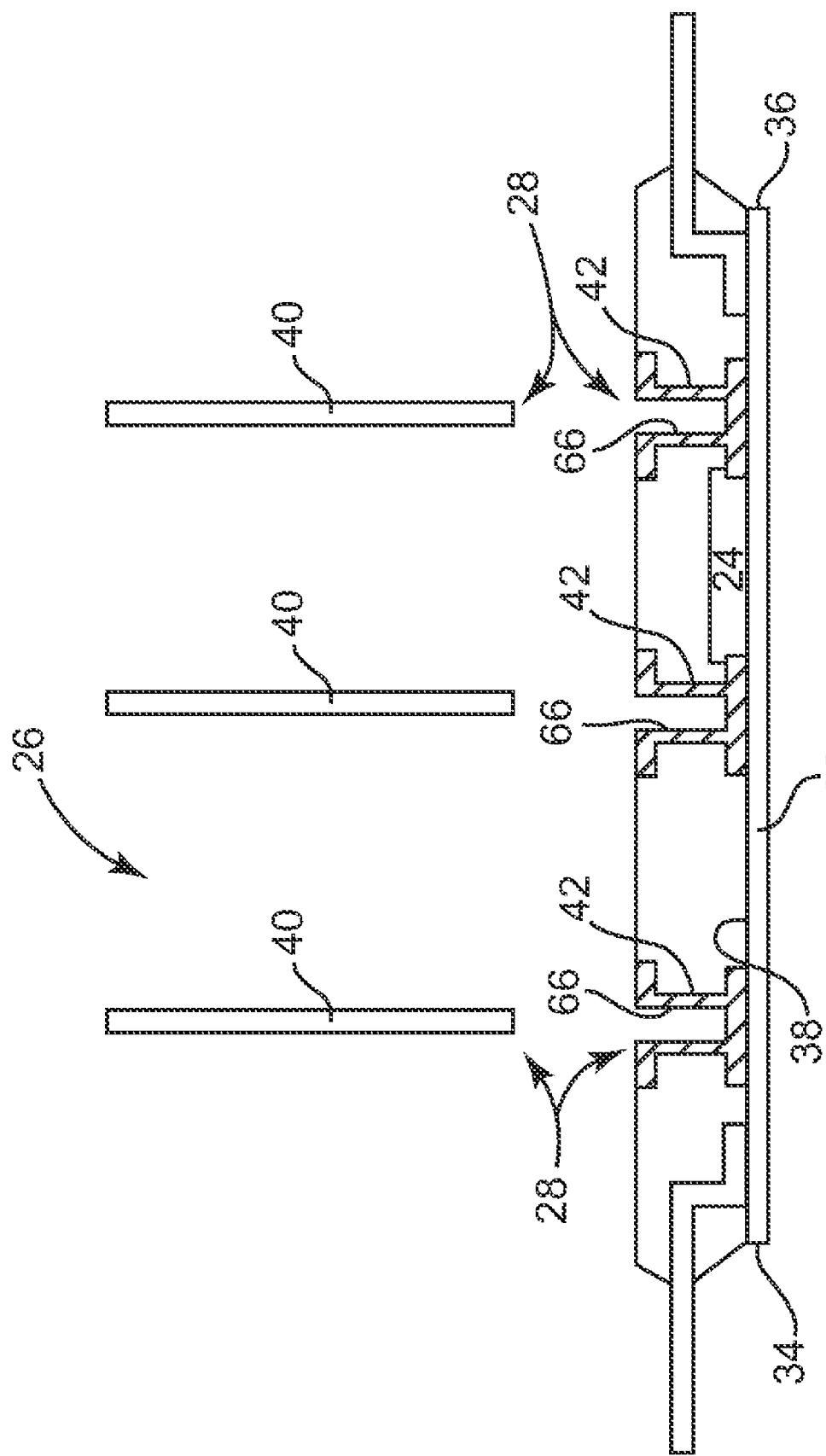

FIG. 4 is a side view and FIGS. 5-6 are partial cross-sectional views of a process 200 for fabricating the electronic device 100 of FIG. 3A that includes an array 26 of leads 28 connected to major surface 38 of carrier 22 according to one embodiment. Process 200 includes a mold 202 configured to encapsulate module 20 with plastic material. In one embodiment, mold 202 includes transfer mold having a first mold portion 204 and a second mold portion 206 configured to mate with first mold portion 204. First mold portion 204 defines a cavity 208, and second mold portion 206 defines a mating cavity 210 and a piston 212 configured to deliver fluid encapsulation material to cavities 208, 210. The volume of the fluid encapsulation material delivered by piston 212 corresponds to the size of cavity 208. In one embodiment, an optional foil 214 is provided as a mold release for both mold 202 and module 20.

During molding, module 20 is inserted into cavity 210. Foil 214 is optionally positioned between sealing surface 70 and first mold section 204 as module 20 is clamped in mold 202. In one embodiment, cavity 208 is defined by an upper surface 220 that is configured to seal against sealing surface 70 of second lead component 42 to prevent or minimize the possibility of encapsulation material entering hole 66. During molding, encapsulation material 52 is injected by piston 212 into cavities 208, 210 and covers carrier 22, chip 24, and the volume between second lead components 42. In one embodiment, encapsulation material 52 surrounds shoulder 62 (FIG.

2) of second lead component 42, and hole 66 and sealing surface 70 are sealed off from the molded plastic by foil 214. After injection of encapsulation material 52 into cavity 208, encapsulation material 52 is cooled to form a solid body.

After molding, mold 202 is opened and electronic device 100 (FIG. 3A) is removed from cavities 208, 210. In one embodiment, foil 214 is employed as a mold release, protects hole 66 from filling with plastic compound, and ensures the desired sealing characteristics between sealing surface 70 and upper surface 220 of cavity 208.

With reference to FIGS. 4-6, in one embodiment sealing surface 70 is exposed relative to encapsulation material 52 after molding. In another embodiment, encapsulation material 52 is disposed on sealing surface 70, and lead 40 defines a diameter that is thicker than the encapsulation material 52 above second lead components 42.

In one embodiment, an array 26 of leads 28 is connected to a major surface of carrier 22 and includes first lead components 40 that project vertically through encapsulation material 52. In one embodiment, each lead 28 in the array 26 is substantially perpendicular to carrier 22.

FIG. 5 is a partial cross-sectional view of module 20 after molding encapsulation material 52 over carrier 22, chip 24, and between lead components 42. Encapsulation material 52 has solidified around lead components 42 of module 20 and holes 66 remain open.

FIG. 6 is a partial cross-sectional view of first lead components 40 being inserted into holes 66 of second lead components 42. In one embodiment, first lead component 40 is press-fit into holes 66 of second lead components 42. In another embodiment, first lead component 40 is electrically connected within hole 66 of second lead component 42 by soldering, conductively gluing, or braising. After attachment, leads 28 project normally away from carrier 22 and out of encapsulation material 52 for subsequent connection to other electronic devices. In one embodiment, the area of first major surface 38 of carrier 22 is greater than the area of edges 34, 36 of carrier 22, such that leads 28 are densely packed within array 26 to provide higher input/output connector density for package 100 (FIG. 3A).

FIGS. 7-9 are partial cross-sectional views of another process for fabricating an electronic device including an array of leads connected to a major surface of a carrier according to one embodiment.

FIG. 7 is a cross-sectional view of semiconductor module 320 including a carrier 322, chips 324 connected to carrier 322, and an array of second lead components 342 connected to carrier 322.

In one embodiment, carrier 322 is a direct copper bonded carrier including a substrate 330 and a metal layer 334 connected to substrate 330. Other forms of carrier 322 are also acceptable, such as the leadframes described above.

Chips 324 and second lead components 342 are electrically connected to a copper metal layer 334. Chips 324 are similar to chips 24 described above, and second lead components 342 are solid metal plugs defining a sealing surface 370.

In one embodiment, molding process 200 described above is employed to mold encapsulation material 352 between each lead component 342, over chips 324, and over first major surface 338 of frame 334. In one embodiment, module 320 is inserted into mold cavities 208, 210 of mold 202 (FIG. 4), and sealing surface 370 enables mold 202 to clamp down upon module 320 such that the encapsulation material 352 is transferred molded over module 320 and around second lead components 342 without appreciable leakage of encapsulation material 352.

FIG. 8 is a partial cross-sectional view of module 320 including encapsulation material 352 molded around lead components 342. In one embodiment, holes 366 are formed in lead components 342 with a drill bit or other mechanical apparatus after molding of encapsulation material 352.

FIG. 9 is a partial cross-sectional view of first lead components 340 connected with second lead components 342 to define a semiconductor package electronic device having an array of leads connected to first major surface 338. In one embodiment, first lead components 340 are press-fit into holes 366 (FIG. 8) of second lead components 342. In another embodiment, first lead components 340 are soldered, or brazed, or glued into holes 366 of second lead components 342.

FIGS. 10-12 are partial cross-sectional views of another process for fabricating an electronic device 400 including an array of leads 414/440 connected to a major surface 411 of a carrier 410 according to one embodiment. Electronic device 400 includes a module 402 and encapsulation material 404 disposed over module 402. Module 402 includes a carrier 410, chips 412 connected to carrier 410, and lead components 414 connected to carrier 410.

In one embodiment, carrier 410 is a multi-layer substrate including a first non-conductive layer 420 and a second conductive layer 422. Suitable carriers 410 include direct copper bonded carriers and leadframes (leaded or non-leaded).

Chips 412 and lead components 414 are connected to conductive layer 422 of carrier 410. Chips 412 are similar to chips 24 described above, and lead components 414 are similar to second lead components 342 (FIG. 7) described above.

In one embodiment, encapsulation material 404 is molded over carrier 410, chips 412, and lead components 414 such that lead components 414 are entirely covered with encapsulation material. The molding of encapsulation material 404 includes transfer molding and compression molding of plastic materials as described above.

FIG. 11 is a partial cross-sectional view of encapsulated module 402 including a bore or a hole 430 formed in encapsulation material 404 and lead component 414. In one embodiment, hole 430 is drilled through encapsulation material 404 and into lead component 414 with a mechanical drill. In other embodiments, hole 430 is formed through a chemical process.

FIG. 12 is a partial cross-sectional view of electronic device 400 including first lead components 440 inserted into holes 430 (FIG. 11) and connected with lead components 414. Leads 440 and lead components 414 combine to define an array of leads 450 connected to and distributed over major surface 411 of carrier 410. Leads 450 are substantially normal (or perpendicular) to carrier 410 and project through encapsulation material 404. In general, a higher density of leads 450 may be placed on major surface 411 of carrier 410 to provide a higher number of input/output connectors for electronic device 400. In one embodiment, leads 450 are high voltage leads and are configured to have a minimum creepage between adjacent lead components 440.

FIGS. 13-15 are partial cross-sectional views of another process of fabricating an electronic device 500 including an array of leads 514/540 connected to a major surface 511 of a carrier 510 according to one embodiment. Electronic device 500 includes a module 502 that is similar to module 320 (FIG. 7). Module 502 includes a carrier 510, chips 512 connected to carrier 510, and lead components 514 connected to carrier 510.

In one embodiment, lead components 514 are pre-drilled to include a partial bore 516 (a blind hole 516) leaving a cap 518 closing off one end of bore 516. Cap 518 provides a sealing surface that enables a cavity mold to seal to seal against cap 518 when molding encapsulation material 504 around lead components 514.

FIG. 14 is a partial cross-sectional view of module 502 after end cap 518 (FIG. 13) has been removed. In one embodiment, end cap 518 is etched or removed to open bore 516. Generally, etching metal is more expensive than drilling metal. For this reason, lead component 414 is partly opened (for example by drilling) and the remaining cap portion 518 is later removed, for example by chemical etching. Pre-drilling bore 516 into lead components 514 leaves a selected amount of end cap 518 as a sealing surface to protect bore 516 during molding of encapsulation material 504. After molding, end cap 518 is removed by etching or other removal processes to provide a connection hole for plugging vertical leads into lead components 414.

FIG. 15 is a partial cross-sectional view of electronic device 500 including leads 540 inserted into bore 516 (FIG. 14) of lead component 514. Leads 540 are distributed over the major surface 511 of carrier 510. Adjacent leads 540 are suitably spaced to minimize undesirable voltage creepage between the adjacent leads 540.

Embodiments provide high density input/output leads for a semiconductor package that is configured to minimize creepage between adjacent leads. Conventional semiconductor packages provide leads extending from peripheral sides of the package. Due to constraints related to the package size, only a limited number of peripheral leads may be provided on the conventional semiconductor package. The linear space constraints for the disposition of peripheral leads on conventional packages can undesirably enable voltage creepage between adjacent leads. In contrast, embodiments described herein provide an array of leads distributed over a relatively large area of a major surface of a carrier in a manner that configures the leads to be suited for high voltage applications having minimum voltage creepage.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of a carrier including an array of leads extending from a major surface of the carrier. Therefore, it is intended that this invention be limited only by the claims and the equivalents thereof.

What is claimed is:

1. An electronic device comprising:
   a carrier defining a first major surface;
   a chip attached to the first major surface;
   an array of leads connected to the first major surface; and
   a thickness of encapsulation material disposed on the first major surface of the carrier;
   wherein each lead extends through the thickness of the encapsulation material.

2. The electronic device of claim 1, wherein the carrier comprises a leadframe defining an island, the chip attached to the island, and the encapsulation material is disposed over the chip and between each lead in the array of leads.

3. The electronic device of claim 1, wherein the carrier comprises a ceramic layer and a metal layer disposed over the ceramic layer, the metal layer defining the first major surface of the carrier and the chip attached to the metal layer.

4. The electronic device of claim 1, wherein the chip comprises an integrated circuit having a first electrode on a first face of the chip and a second electrode on a second face opposite the first face of the chip, the first electrode electrically coupled to the first major surface of the carrier.

5. The electronic device of claim 1, wherein each lead in the array of leads comprises:
   a second lead component connected to the carrier substantially normal to the first major surface and extending through the thickness of the encapsulation material; and
   a first lead component connected to the second lead component, the first lead component extending away from the carrier and extending away from the thickness of encapsulation material.

6. The electronic device of claim 5, wherein the second lead component comprises:
   a base connected to the first major surface of the carrier;
   a shoulder opposite the base; and
   a body extending between the base and the shoulder;
   wherein at least the shoulder and the body define a hole that is configured to receive the first lead component.

7. The electronic device of claim 6, wherein the first lead component is press-fit into the hole.

8. The electronic device of claim 6, wherein the first lead component is coupled into the hole by one of a solder, a braze, and a weld.

9. The electronic device of claim 6, wherein the shoulder defines a sealing surface that enables the encapsulation material to be disposed between each lead in the array of leads, the sealing surface exposed relative to the encapsulating material.

10. The electronic device of claim 6, wherein the base, the body, and the shoulder of the second lead component are covered with the encapsulating material and the first lead component is exposed relative to the encapsulating material.

11. The electronic device of claim 1, wherein the carrier defines a second major surface opposite the first major surface, the second major surface exposed relative to the encapsulating material.

12. A semiconductor package comprising:
    a carrier defining a first major surface extending between opposing edges of the carrier;
    a chip connected to the first major surface;
    a plurality of lead sockets connected substantially normal to the first major surface,
    encapsulation material disposed over the carrier and the chip and around at least a portion of each of the lead sockets; and
    a lead in electrical contact with at least one of the lead sockets.

13. The semiconductor package of claim 12, wherein each of the lead sockets comprises:
    a base connected to the first major surface; and
    a shoulder spaced apart from the base, the shoulder defining a hole and a sealing surface;
    wherein the encapsulation material is disposed around a periphery of the shoulder.

14. The semiconductor package of claim 13, wherein the encapsulation material is disposed over the shoulder, and the hole is formed in the encapsulation material and in the shoulder.

15. The semiconductor package of claim 12, wherein a thickness of the encapsulation material is disposed over the carrier, and a diameter of the lead is greater than the thickness of the encapsulation material.

16. The semiconductor package of claim 12, wherein a spacing between each of the lead sockets is configured to minimize voltage creepage between adjacent lead sockets.

* * * * *